US 7,023,279 B2

(12) United States Patent
Grasset et al.

(10) Patent No.: US 7,023,279 B2
(45) Date of Patent: Apr. 4, 2006

(54) LINEAR PRE-AMPLIFIER FOR RADIO-FREQUENCY POWER AMPLIFIER

(75) Inventors: Jean-Charles Grasset, Moirans (FR); Christophe Pinatel, Saint Laurent du Var (FR)

(73) Assignee: STMicroelectronics S.A., Montrouge (FR)

( * ) Notice: Subject to any disclaimer, the term of this patent is extended or adjusted under 35 U.S.C. 154(b) by 236 days.

(21) Appl. No.: 10/111,122

(22) PCT Filed: Aug. 21, 2001

(86) PCT No.: PCT/FR01/02642

§ 371 (c)(1),
(2), (4) Date: Jul. 22, 2002

(87) PCT Pub. No.: WO02/17480

PCT Pub. Date: Feb. 28, 2002

(65) Prior Publication Data

US 2003/0107441 A1    Jun. 12, 2003

(30) Foreign Application Priority Data

Aug. 21, 2000  (FR) .................................. 00 10765

(51) Int. Cl.
*H03F 3/04* (2006.01)
(52) U.S. Cl. ...................... 330/302; 330/294
(58) Field of Classification Search .................. 330/98, 330/292, 294, 302, 303, 311
See application file for complete search history.

(56) References Cited

U.S. PATENT DOCUMENTS

| 3,805,164 A | 4/1974 | Callaway |
| 4,184,176 A * | 1/1980 | Sahara et al. ............... 348/707 |
| 4,764,736 A | 8/1988 | Usui et al. |
| 5,142,239 A | 8/1992 | Brayton et al. |
| 6,005,441 A * | 12/1999 | Kawahara .................... 330/294 |

FOREIGN PATENT DOCUMENTS

DE   195 09 295 A   9/1996

OTHER PUBLICATIONS

International Search Report from priority application No. PCT/FR01/02642 filed Aug. 21, 2001.
Patent Abstracts of Japan vol. 010, No. 099 (E-396) & JP 60 240203 A Nov. 29, 1985.

* cited by examiner

*Primary Examiner*—My-Trang Nu Ton
*Assistant Examiner*—Cassandra Cox
(74) *Attorney, Agent, or Firm*—Lisa K. Jorgenson; William R. McClellan; Wolf, Greenfield & Sacks, P.C.

(57) ABSTRACT

An amplifier including an input circuit tuned to the frequency to be amplified and receiving as an input the signal to be amplified, a first transistor connected in common base, the emitter of which is coupled to the input circuit and the collector of which provides the output signal of the amplifier, and a feedback circuit feeding back to the base of the transistor a fraction of the output voltage. The feedback circuit includes a capacitive bridge and a second transistor. The input circuit can be used in a first stage of the amplifier or of a mixer.

30 Claims, 6 Drawing Sheets

LINEAR PRE-AMPLIFIER FOR RADIO-FREQUENCY POWER AMPLIFIER

BACKGROUND OF THE INVENTION

1. Field of the Invention

The present invention relates to RF (radiofrequency) amplifiers, and more specifically to preamplifiers driving a power amplifier supplying an antenna.

2. Discussion of the Related Art

FIG. 1 illustrates a conventional RF amplification chain 1. The amplification chain includes a signal processing block 2, a preamplifier 3 driving a power amplifier 4 coupled to an antenna 5. Block 2 includes two stages for shaping the signal and mixing the signal with the desired carrier.

As illustrated in FIG. 2, preamplifier 3 may be followed by a switch 6 with two positions, connecting output S of the preamplifier to one of two outputs S1 and S2. In certain applications, it is indeed necessary to interpose two different filters between preamplifier 3 and power amplifier 4 or to supply, with the same preamplifier, two different power amplifiers.

This type of circuit finds an application in fields such as that of cell phones, where the frequency is high, greater than one gigahertz (GHz).

In such fields, some standards use a carrier modulated both in phase and in amplitude. These standards are for example the CDMA ("Code Division Multiple Access") or the W-CDMA (W standing for "Wideband"). In these fields, RF preamplifiers and amplifiers need to have high performance, needing to be linear both in phase and in amplitude.

In the state of the art, block 2 is an integrated circuit formed on a silicon substrate. Amplifiers 3 and 4 are external units, the active components of which are formed on gallium arsenide substrates. Indeed, gallium arsenide components have a higher cut-off frequency and withstand higher voltages than silicon components.

FIG. 3 illustrates a conventional preamplifier followed by a switching circuit 6. Preamplifier 3, hereafter more simply designated as "the amplifier", includes an input pad E, coupled to the gate of a transistor $T_A$ via an impedance matching circuit 10. Transistor $T_A$ is a gallium arsenide transistor of FET type, connected in common source. The gate of transistor $T_A$ is biased in direct current by a biasing unit 11, not detailed. The source of transistor $T_A$ is coupled to a ground pad 13 (GND) via an inductive resistor L. Pad 13 is connected to ground M of the circuit via a connection wire. This connection wire has, in the considered frequency range (from 1 to a few GHz), a parasitic bonding inductance. The drain of transistor $T_A$ is coupled to a supply pad 15 via an impedance matching circuit 14. The connection of pad 15 to a supply line VDD is made by a wire also having a bonding inductance Lb. A capacitor Cgd is shown between the gate and the drain of transistor $T_A$. This capacitor is the stray capacitor between the gate and the drain of transistor $T_A$. The amplifier has its output on the drain of transistor $T_A$.

A switch 6 receives the output of amplifier 3. It has two outputs, S1 and S2. Switch 6 is formed by means of four FET-type gallium arsenide transistors T. The gates of transistors T receive voltages +V or −V via resistors R, and the circuit is formed so that one of the two outputs receives the output signal of the amplifier, while the other one is grounded. The presence of switch 6 in series with the amplifier introduces losses in the processing chain.

The amplifier of FIG. 3 is formed of a single stage. Because of its low adaptability, a two-stage circuit is preferred to it, like that of FIG. 4.

In FIG. 4, the amplifier includes a first stage, similar to the amplifier of FIG. 3. Impedance matching circuit 14 here has an intermediary output enabling driving the second stage of the amplifier. The second stage is formed of a transistor $T_B$, also connected in common source. Transistor $T_B$ is also made of gallium arsenide and of FET type. The gate of transistor $T_B$ receives the output of the first stage. Its source is connected to a ground pad 17, connected to ground M by a connection having a bonding inductance Lb. Its drain is connected to an output pad S of the amplifier. It is also connected to an impedance matching circuit 18, itself connected to a supply pad 19, connected to a power supply VDD2 via a bonding inductance Lb. If desired, a switch 6 like that of FIG. 3 is connected on output S.

A disadvantage of the amplifier of FIG. 4 is that it includes gallium arsenide transistors, and accordingly, its integration on the integrated circuit of processing block 2, having a silicon substrate, is impossible. Further, the amplifier of FIG. 4 has relatively high power consumption. Also, the structure is sensitive to noise, especially noise introduced by the bonding inductances, which are difficult to evaluate.

SUMMARY OF THE INVENTION

An object of the present invention is to provide an amplifier operating of high frequencies that can be integrated on a silicon substrate.

An object of the present invention is to provide a low-power consumption amplifier.

An object of the present invention is to provide an amplifier that has a low sensitivity to noise, in particular to noise introduced by bonding inductances.

To achieve these and other objects, the present invention provides an amplifier including an input circuit tuned to the frequency to be amplified and receiving, as an input, the signal to be amplified, a first transistor connected in common base, the emitter of which is coupled to the input circuit and the collector of which provides the output signal of the amplifier, and a feedback circuit feeding back to the base of said transistor a fraction of the output voltage.

According to an embodiment of the present invention, the feedback circuit is formed by a capacitive bridge formed of a first capacitor coupled between the amplifier output and the base of the first transistor, and of a second capacitor connected in series with the first capacitor and coupled between the base of the first transistor and a virtual ground node.

According to an embodiment of the present invention, said virtual ground node is connected to a first supply pad.

According to an embodiment of the present invention, the feedback circuit includes a second transistor connected as a follower transistor, the base of which is connected to the feedback circuit, the emitter of which is connected to the base of the first transistor and coupled to ground via a first resistor, and the collector of which is connected to a supply voltage.

According to an embodiment of the present invention, the virtual ground node is coupled to ground via a third capacitor.

According to an embodiment of the present invention, the input circuit is formed of two branches, a first branch of the input circuit including a second resistor in series with a first inductive resistor and coupling an input of said circuit to the first supply pad, and a second branch of said circuit including a third resistor in series with a fourth capacitor and coupling the input of the input circuit to the emitter of the first transistor.

According to an embodiment of the present invention, the amplifier includes a network formed of a second inductive resistor and of a fifth capacitor connected in parallel, to couple the collector of the first transistor to a second supply pad, and the emitter of the first transistor is coupled to ground by a fourth resistor or a third inductive resistor.

According to an embodiment of the present invention, the first transistor, its connections, and the feedback circuit are duplicated to form several sets, each set being connected to the input circuit and selectively powered so that the amplifier can provide an output signal on one of several outputs.

According to an embodiment of the present invention, the second branch of the input circuit is also duplicated, each of said sets being connected to one of the duplicated second branches of the input circuit, and the capacitors of each of said duplicated second branches having different capacitance values, so that the tuning of the input circuit is performed on different frequencies according to the considered second branch.

According to an embodiment of the present invention, the input circuit forms part of an input stage including a third transistor connected in common emitter, receiving on its base the input signal, the emitter of which is coupled to ground by a fourth inductive resistor, and the collector of which is coupled to the input of the input circuit.

According to an embodiment of the present invention, the input circuit and the third transistor are duplicated a predetermined number n of times, the n input circuits being capable of being tuned on close frequencies to slightly increase the amplifier passband and decrease the sensitivity of the amplifier to dispersions due to the technological manufacturing processes.

According to an embodiment of the present invention, the input circuit forms part of a mixer.

The foregoing and other objects, features and advantages of the present invention, will be discussed in detail in the following non-limiting description of specific embodiments in connection with the accompanying drawings, in which:

DETAILED DESCRIPTION

Figure 5:
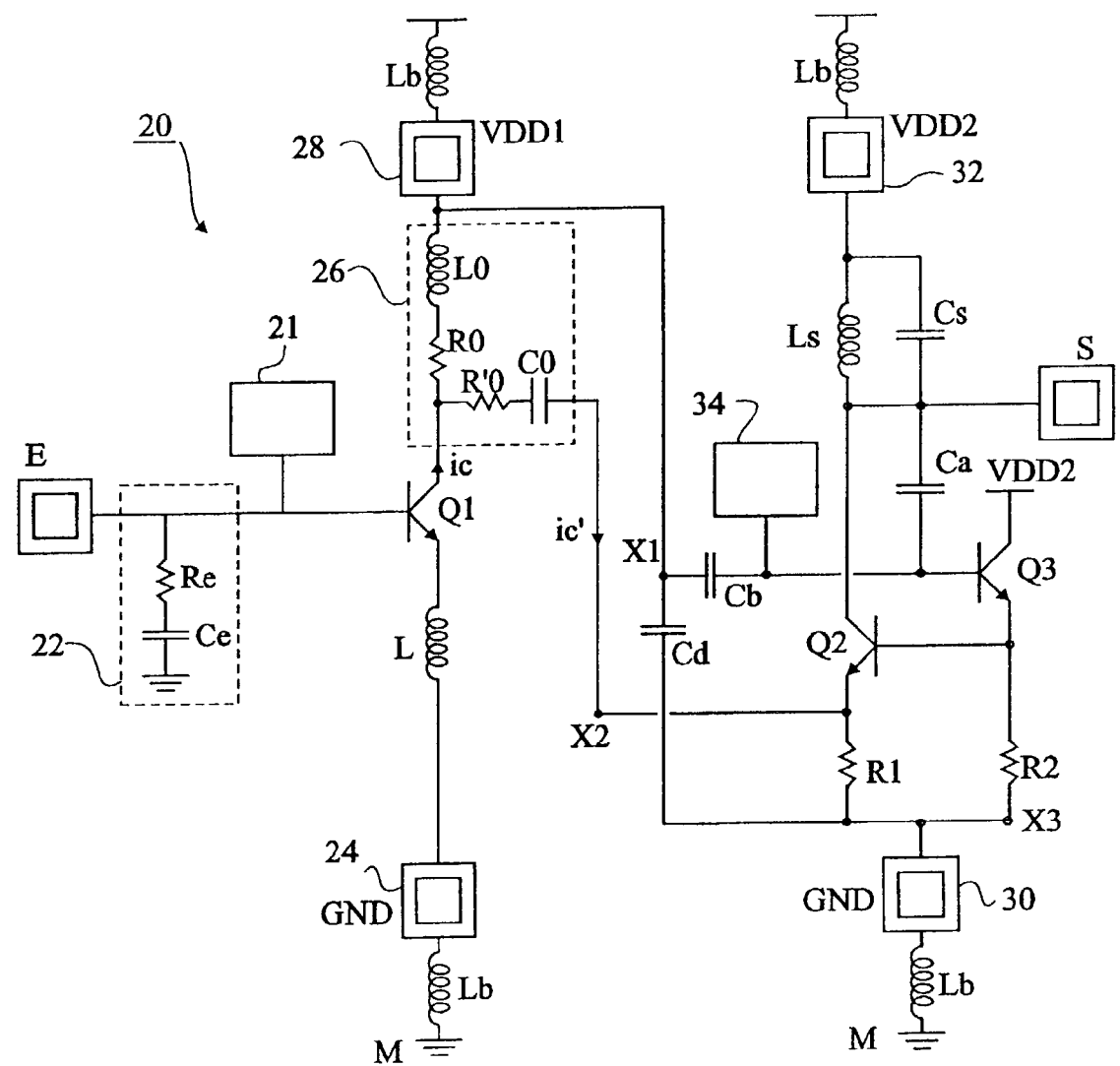
FIG. 5 illustrates a first embodiment of the present invention.

In FIG. 5, an amplifier 20 according to the present invention includes silicon bipolar transistors. A priori, the applicant was dissuaded from making this choice since silicon transistors, in the frequency range used, have a very low breakdown voltage. For example, for a frequency on the order of one gigahertz, a silicon transistor with a base in the air (BVCEO) only withstands from 3 to 4 volts between its emitter and its collector, which can be incompatible with the supply voltages or the excursions of the signal present in the circuit.

Amplifier 20 is formed of two stages. An input pad E of the amplifier is connected to the base of an NPN-type silicon bipolar transistor Q1. The base of transistor Q1 is biased in direct current by a biasing block 21, which is not detailed. An input impedance 22, formed of a resistor Re in series with a capacitor Ce, connects the base of transistor Q1 to ground. The emitter of transistor Q1 is coupled to a ground pad 24 (GND) via an inductive resistor L. The ground connection of pad 24 introduces a bonding inductance Lb. The collector of transistor Q1 is connected to an impedance matching circuit 26. Circuit 26 includes two branches. The first branch is formed of a resistor R0 in series with an inductive resistor L0. This branch connects the collector of Q1 to a supply pad 28 (VDD1), which introduces a bonding inductance Lb by its connection to a supply line. The second branch of circuit 26 is formed of a resistor R'0 in series with a capacitor C0. This branch connects the collector of Q1 and a node X2 corresponding to the output of the first stage of the amplifier. It should be noted that, advantageously, input resistor Re is made in the same material as resistor R0. Thus, technological dispersions due to the manufacturing processes will have little effect on the amplifier gain.

The second stage of amplifier 20 includes an NPN silicon bipolar transistor Q2, connected in common base. The applicant has chosen a common base assembly since this assembly is more linear than a common emitter assembly when driven in current, despite generally accepted ideas tending to draw away from this choice. Indeed, the common base assembly is driven in current, and experts would consider that a common base assembly would not enable the amplifier to have a sufficient power gain.

The structure of the second stage of amplifier 20 will now be described. Node X2 is connected to the emitter of transistor Q2. The emitter of transistor Q2 is coupled via a resistor R1 to a node X3 connected to a ground pad (GND) 30, which introduces a bonding inductance Lb by its ground connection. Resistor R1 may also be replaced with an inductive resistor L3 (not shown), which enables avoiding the voltage drop in resistor R1. The collector of transistor Q2 is connected to an output pad S, forming the output of amplifier 20. The collector of transistor Q2 is coupled, via an inductive resistor Ls connected in parallel with a capacitor Cs, to a supply pad 32 (VDD2). A bonding inductance Lb is introduced by connection pad 32 to a supply line. Supply pads VDD1 and VDD2 may, outside of the circuit, be connected to a common supply line. The fact that supply pads VDD1 and VDD2 are separate results from the fact that supply voltages VDD1 and VDD2 must be brought to different points of the circuit with different decouplings. Indeed, it is difficult in this type of circuit to have a single pad to supply both stages, due to the parasitic inductive resistors brought from one stage to the other, which degrade the isolation, or even cause a risk of oscillation. The bonding inductances have all been indicated with the same reference, Lb. However, they can have various values, and are taken into account for the forming of the amplifier components.

The base of transistor Q2 is, on the one hand, coupled to node X3 by a resistor R2 and, on the other hand, to the emitter of a transistor Q3. Transistor Q3 is a silicon NPN transistor, connected as a follower transistor. The collector of transistor Q3 is connected to supply pad VDD2. The base of transistor Q3 is biased by a biasing unit 34, which is not detailed. The base of transistor Q3 is also coupled to output pad S via capacitor Ca and to a node X1 connected to supply pad 28 via a capacitor Cb. A capacitor Cd connects nodes X1 and X3.

The operation of amplifier 20 will now be explained in detail, and the advantages thereof will be disclosed.

Node X1, connected to VDD1, is a ground node from the point of view of alternating currents, which can be called a "virtual ground". Capacitors Ca and Cb thus form a capacitive dividing bridge between output S and this ground. The fraction of output voltage thus brought on the base-emitter space of transistor Q2 (via transistor Q3), on the one hand, causes a feedback that improves the linearity of the assembly, and on the other hand, sets the output impedance of the assembly to a value which is a multiple of (R0+R'0) without causing any loss as would a resistor in parallel on the output. A capacitive divider has been chosen since it consumes no power and is not noisy.

The second amplifier stage is driven by a current i'c coming from node X2. To have a sufficient current drive, impedance matching circuit 26 is a resonant circuit tuned on the amplifier's operating frequency. A current i'c greater than the alternating current i'c provided by the collector of transistor Q1 is thus obtained, such that i'c # Q.ic, where Q is the quality factor of the resonant circuit. The ratio between i'c and ic is small, for example equal to two or three, but this current increase is sufficient to obtain a sufficient power gain of the amplifier.

It should be noted that the fact of having an output stage including a transistor connected in common base instead of a transistor connected in common emitter as in prior art enables obtaining greater output voltages on the collector of the output transistor. Indeed, the base-collector junction has a breakdown voltage BVCB0 two or three times greater than the emitter-collector junction (BVCE0) and, with an equal impedance, more power can be extracted from the stage without risking to damage the transistor by breakdown.

The present architecture also enables freeing the second stage from noise. Indeed, the first stage can bring to the second stage noise via node X2 and branch R0, L0. This noise is due especially to the bonding inductances, difficult to control, and they can be found at the output after having crossed the second stage. To get rid of said noise, capacitor Cb is connected to node X1 and not to ground (GND). If noise is present on the collector of transistor Q1, it appears at X2 and at X1. Through X2, they are transmitted to the emitter of transistor Q2 and, through X1, they are transmitted to the base of transistor Q2 via capacitor Cb and the base-emitter junction of transistor Q3. The base and the emitter of transistor Q2 receiving identical noise, voltage Vbe between the emitter and the base of transistor Q2, which controls the current coming out of the collector of transistor Q2, remains substantially steady and independent from noise. To enhance the immunity of the second stage against noise, capacitor Cd connects nodes X1 and X3. Thus, the noise is transmitted to X3. Resistors R1 and R2 both have the noise on each of their terminals and the current flowing therethrough is deprived of it.

Another advantage of amplifier 20 is that the biasing of the base of transistor Q3 is easy to set without modifying the characteristics of the rest of the amplifier. Indeed, the voltage applied on the base of transistor Q3 determines the direct current provided by the emitter of transistor Q3 and, thereby, the direct current flowing through the collector of transistor Q2. Now, transistor Q2, which is an output transistor, is the most consuming element of the amplifier. When the power to be provided is high, the direct current flowing through transistor Q2 must by high. However, when the power to be provided is low, the direct current flowing through transistor Q2 needs not be high. Since the direct current flowing through transistor Q2 is easy to set in the amplifier of the present invention, the current consumed by the second stage can be adjusted, by acting upon unit 34, by the second stage according to the required power, with a constant linearity and an almost constant gain.

It should be noted that all the transistors of amplifier 20 are made of silicon. Accordingly, amplifier 20 can easily be formed on the same substrate as processing block 2.

Figure 1:
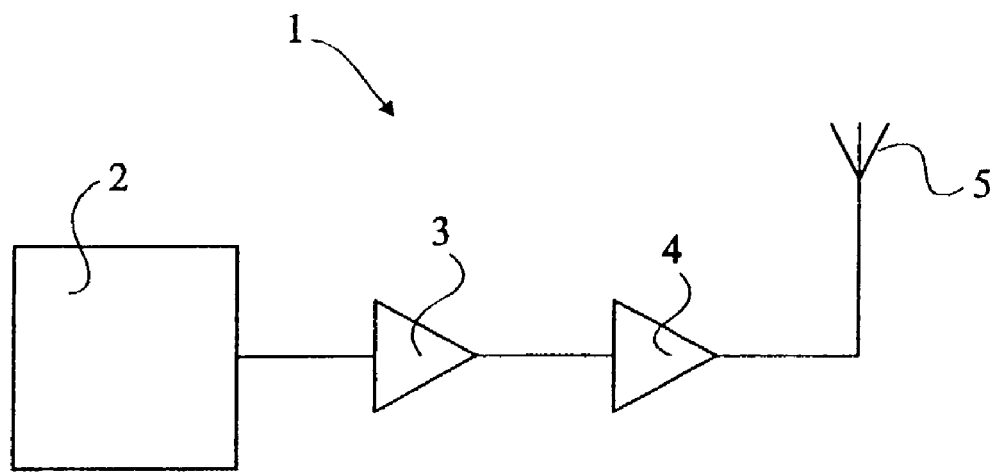
FIG. 1, previously described, illustrates a simplified diagram of a transmission chain.
Figure 2:
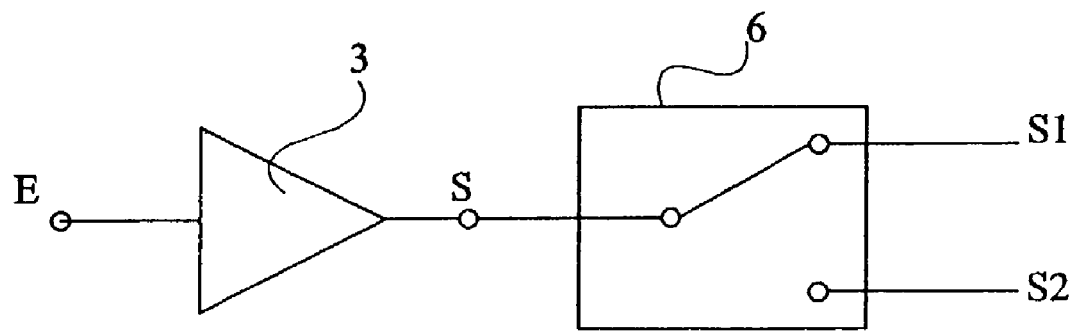
FIG. 2, previously described, illustrates an alternative of a portion of the transmission chain of FIG. 1.
Figure 3:
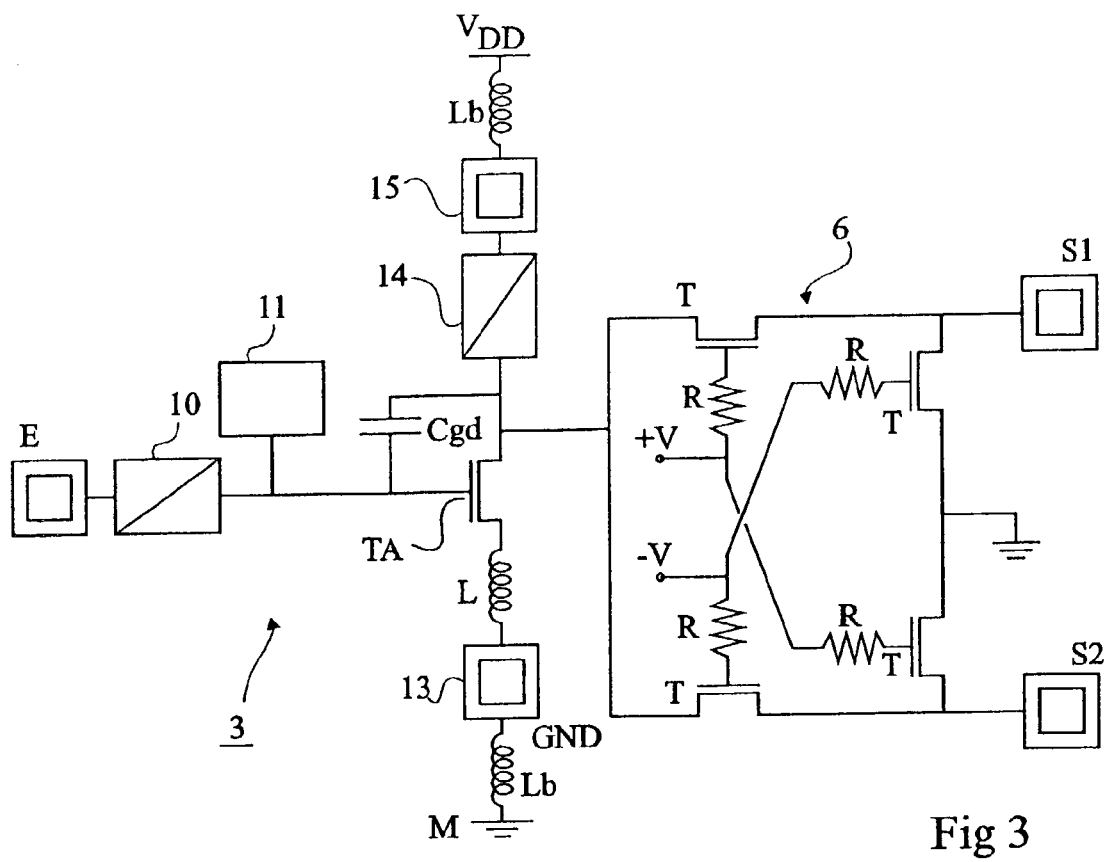
FIG. 3 illustrates a first example of a conventional amplifier, followed by a switch.
Figure 4:
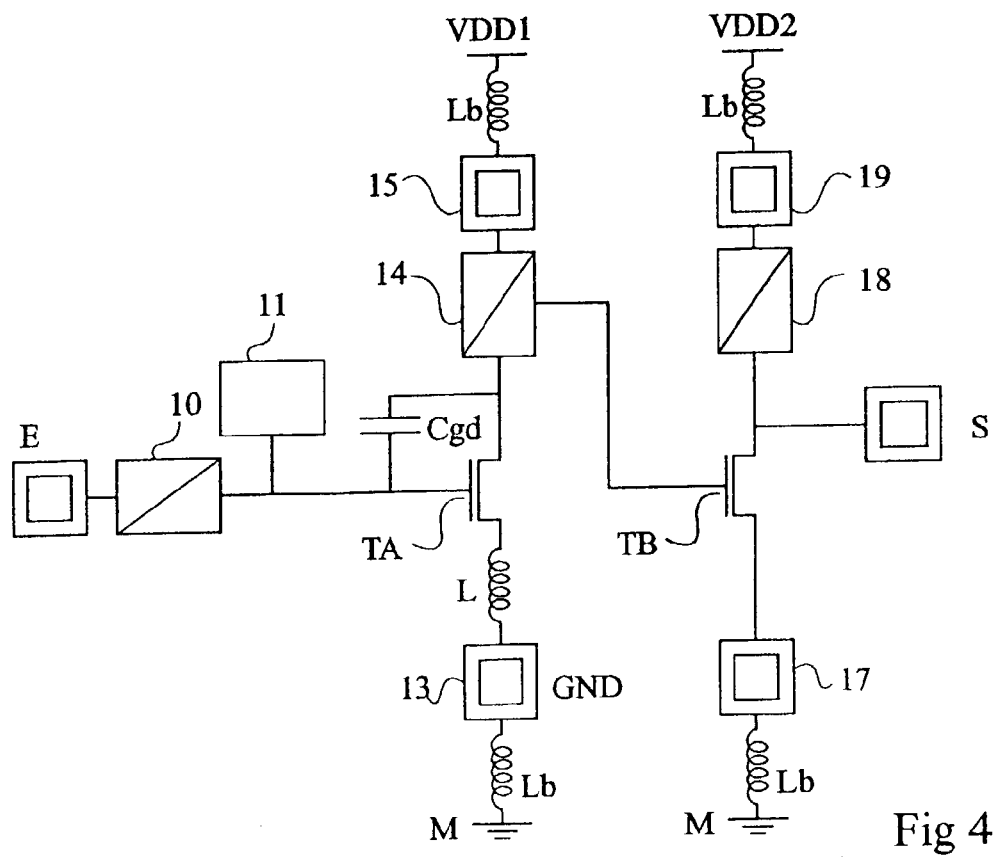
FIG. 4 illustrates a second example of a conventional amplifier.

Further, tests have shown that the amplifier of the present invention has higher performance than the amplifier of FIG. 4 in terms of linearity, of signal-to-noise ratio, and of power consumption (see table 1 at the end of the description).

Another advantage of the amplifier of the present invention is that it is easy to adapt, as will be seen hereafter.

Figure 6A:
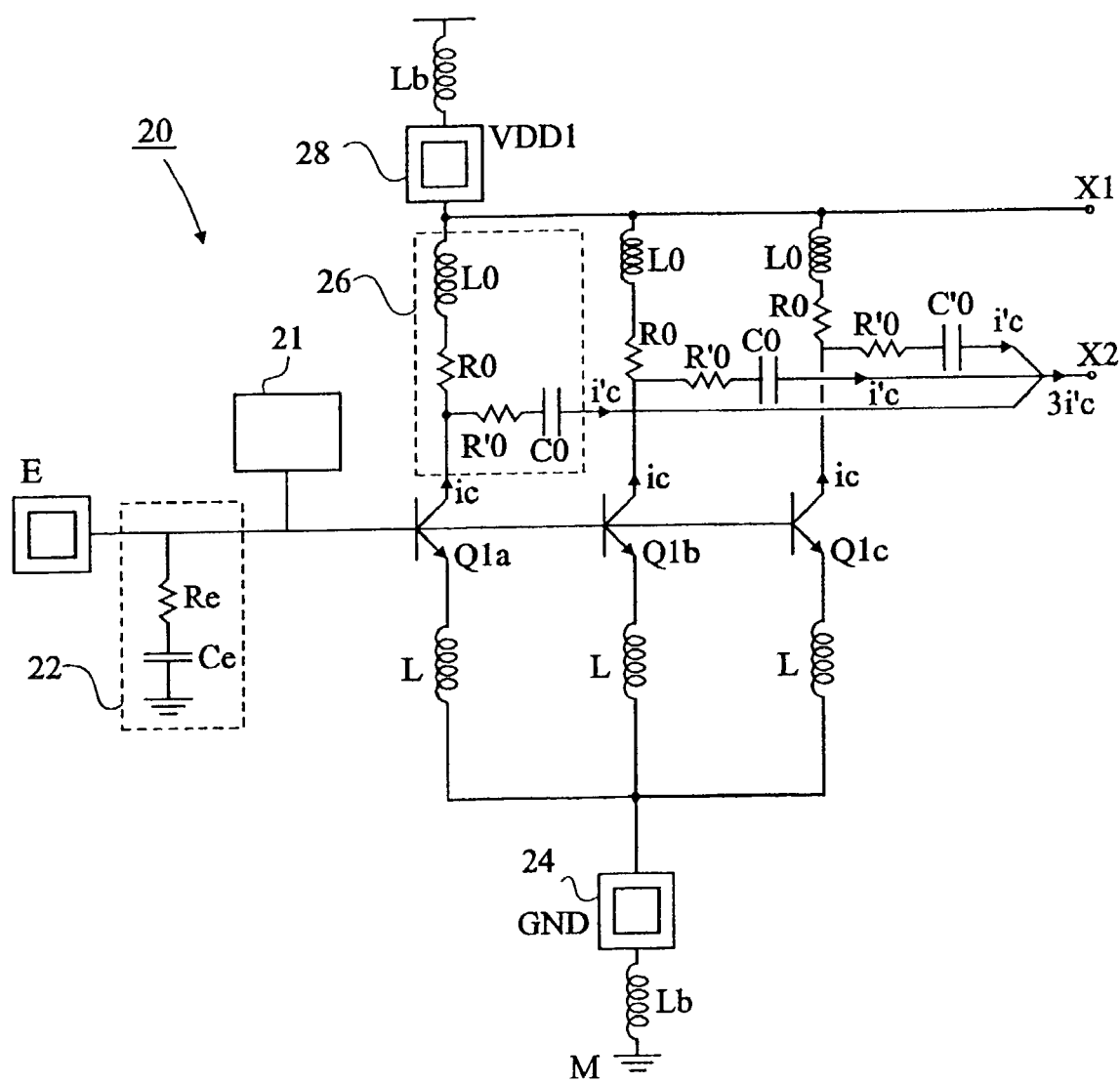
FIGS. 6A and 6B illustrate alternatives of the embodiment of FIG. 5.

FIG. 6A illustrates an alternative embodiment of the amplifier of FIG. 5. In FIG. 6A, the second stage of amplifier 20 has not been shown for clarity. The first stage of the amplifier includes three transistors Q1a, Q1b, and Q1c, the assembly of which is identical to transistor Q1 of FIG. 5. Thus, the base of each of transistors Q1a, Q1b, and Q1c, designated hereafter as Q1i, is connected to an input pad E, to a biasing block 21, and to an input impedance 22, formed of a resistor Re in series with a capacitor Ce. The emitter of each transistor Q1i is connected to supply pad 24 by an inductive resistor L. The collector of each transistor Q1i is connected to supply pad 28 by a first branch R0, L0, of an impedance matching circuit 26. The collector of each transistor Q1i is also connected to node X2 via a second branch R'0, C0 of circuit 26.

The alternative of FIG. 6A also provides an input stage replicating three times the input stage of FIG. 5. As a result, the incoming current at node X2 is equal to three times current i'c flowing through branches R'0, C0 of circuits 26.

Since the incoming current at node X2 determines the output power Ps of the amplifier, increasing this current enables increasing the output power, with no saturation of the transistors of the first stage.

Another advantage of the amplifier of FIG. 6A is that its power gain is increased. Indeed, output power Ps is increased, as has just been seen. Further, input power Pe, which is approximately equal to the square of the useful voltage of input signal Ve divided by resistance Re (Pe # $Ve^2/Re$), is practically independent from the number of transistors Q1i of the first stage, the bases of these transistors drawing a negligible current as compared to the current drawn by Re. Accordingly, the power gain Ps/Pe is also increased.

In an alternative of the amplifier of FIG. 6A, the tuning frequencies of the different circuits 26 are slightly shifted. The tuning frequency of circuit 26 being determined by product L0.C0, the frequency shift of the different circuits 26 may be performed, for example, by giving slightly different values to the capacitances of the capacitors of the second branches of the various circuits 26. This has a double advantage. On the one hand, the amplifier passband will slightly increase and, on the other hand, the amplifier will be less sensitive to possible technological manufacturing dispersions, such as those conventionally affecting capacitances.

It should be noted that, although FIG. 6A shows an input stage with three transistors Q1i, there can be any number of transistors Q1i, and the matching circuits 26 associated with these transistors can be identical or tuned on close frequencies. Also, the emitters of transistors Q1i may be connected to a common inductive resistor connected to ground pad 24, the value of this inductance then being equal to L/n, n being the number of transistors Q1*i*.

Figure 6B:
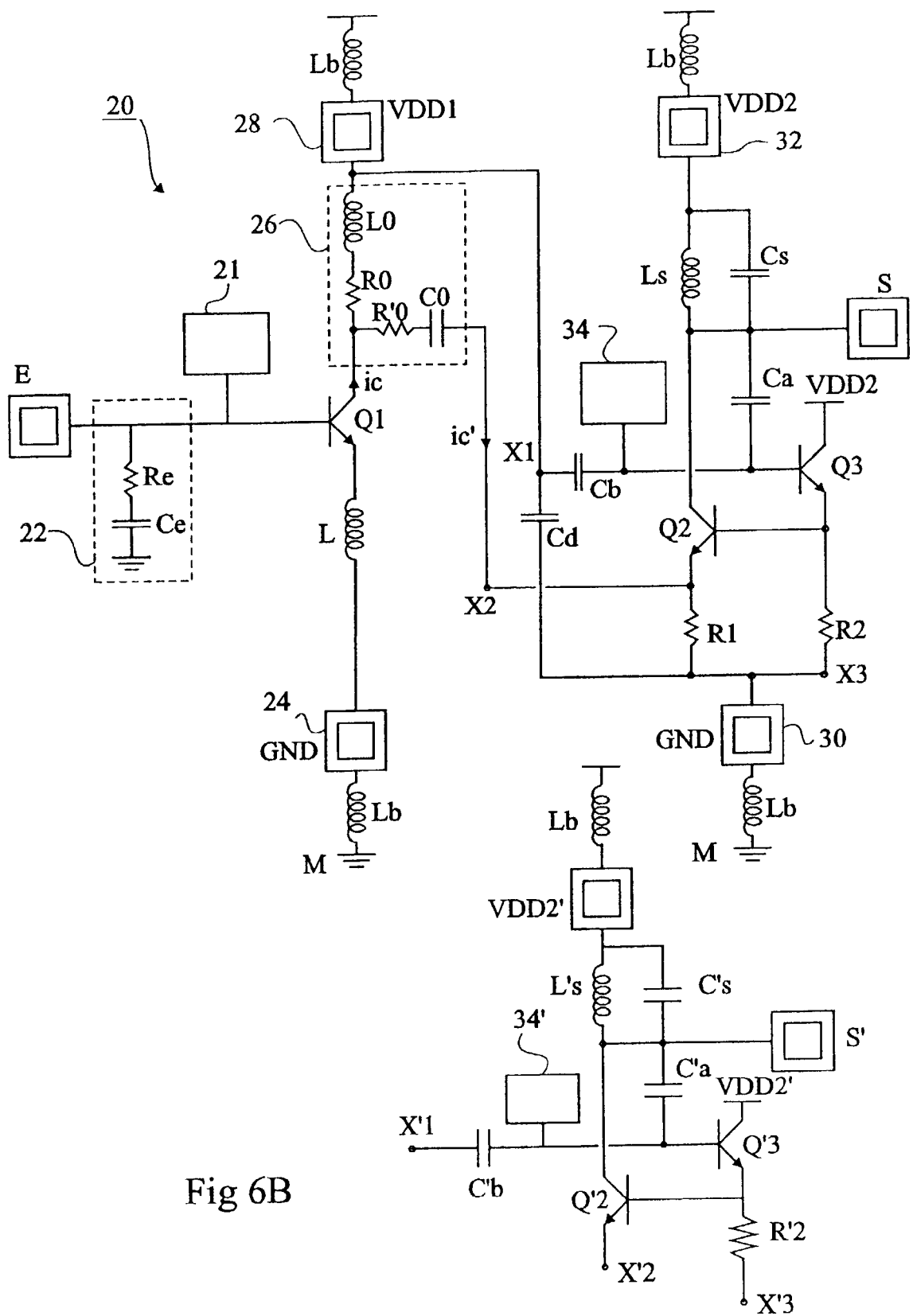

FIG. 6B illustrates another alternative embodiment of the amplifier of FIG. 5, with a switch enabling obtaining two outputs, S and S'.

The amplifier of FIG. 6B first includes an amplifier 20 similar to the amplifier of FIG. 5. It also includes another second stage, identical to the second stage of amplifier 20. This other second stage includes a transistor Q'2 having its emitter connected to a node X'2. The base of transistor Q'2 is connected to the emitter of a transistor Q'3 and to a node X'3 via a resistor R'2. The collector of transistor Q'2 is connected to an output pad S'. It is also connected to a supply pad VDD2' via an inductive resistor L's in parallel with a capacitor C's. A bonding inductance Lb is introduced by the connection of pad VDD2' to a supply line external to the circuit. The collector of transistor Q'3 is connected to a supply voltage VDD'. The base of transistor Q'3 is connected to output S' by a capacitor C'a and to node X'1 by a capacitor C'b. A biasing circuit 34' biases in direct current the base of transistor Q'3. Nodes X'1, X'2, and X'3 are respectively connected to nodes X1, X2, X3, which connections are not shown for clarity.

The second stage of the amplifier is thus totally duplicated. In operation, one or the other of supply pads VDD2 or VDD2' are supplied. According to the chosen pad, one output, S or S', will provide the output signal of the amplifier.

The obtained switch is simple and can easily be incorporated into the same integrated circuit as the amplifier and block 2. Conversely to usual solutions, it introduces no additional losses.

An alternative of the amplifier of FIG. 6B provides significant advantages. In this alternative (not shown), node X'2 of the second additional stage is not connected to node X2, but is connected to a terminal of a capacitor C'0 (not shown), the other terminal of which is connected to the connection node of resistor R'0 and capacitor C0. Accordingly, the second branch of circuit 26 is formed by R'0 in series with C0 for one of the two second stages and by R'0 in series with C'0 for the other.

Since the tuning frequency of circuit 26 depends on the value of the capacitance of the capacitor present in the second branch of this circuit, a first second stage tuned to a frequency f1, determined by C0, and a second second stage tuned to a frequency f2, different from f1 and determined by C'0, can be had with this alternative embodiment. Amplifier 20 then is a multiple-band or multiple-standard amplifier, the input signal being provided, after amplification, by the activated output S or S' with the desired frequency. For example, in an amplifier for a cell phone, frequency f1 may be on the order of 900 MHz and frequency f2 may be on the order of from 1.8 to 2 GHz.

It is also possible, instead of using a common resistor R'0 for the two second stages, to use a resistor other than R'0 for the second second stage. The collector of transistor Q1 is then connected to node X2 via resistor R"0 in series with capacitor C'0 and to node X'2 via a resistor R"0 (not shown) in series with capacitor C'0. This enables, if need be, having a different damping in the two second branches of circuit 26 and, accordingly, a different gain in the two paths of the amplifier.

Figure 7:
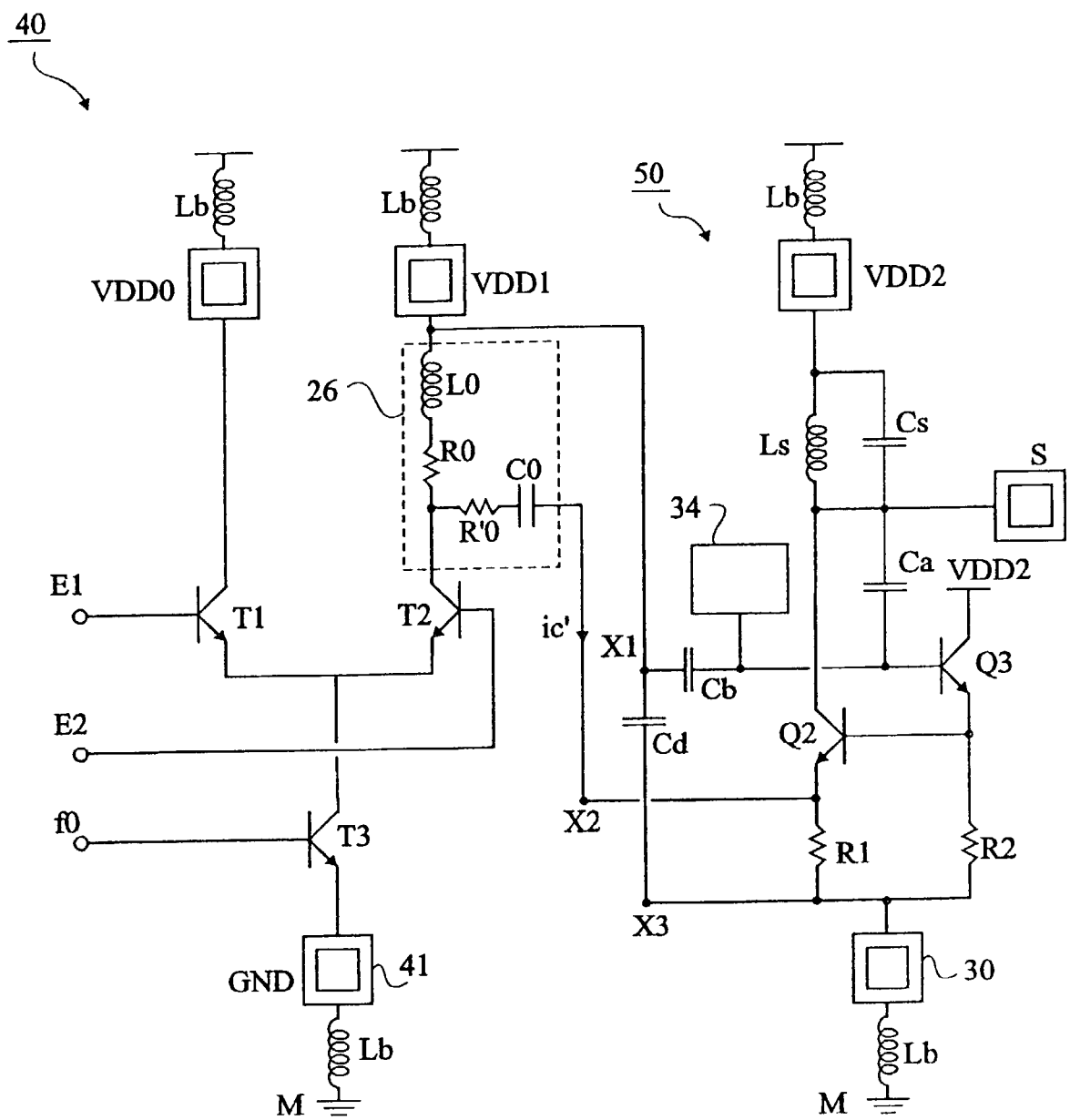
FIG. 7 illustrates a second embodiment of the present invention.

FIG. 7 shows a second embodiment of the present invention, further illustrating the great adaptability of the amplifier of the present invention.

In FIG. 7, a mixer stage 40 is followed by a stage corresponding to the second stage of the amplifier of FIG. 5.

Mixer circuit 40 includes transistors T1 and T2 forming a differential pair. Transistors T1 and T2 receive on their respective bases differential signals E1 and E2 from a local oscillator. The emitters of transistors T1 and T2 are interconnected and connected to the collector of a third transistor T3. Transistor T3 has its emitter coupled to a ground pad 41 GND having, with respect to ground M, a bonding inductance Lb. The base of transistor T3 receives a baseband modulated signal or a signal at an intermediary frequency IF which, when mixed to signals E1 and E2, enables obtaining a modulated signal RF. The collector of transistor T1 is connected to a supply pad VDD0 having a bonding inductance Lb. The collector of transistor T2 is connected to an impedance matching circuit 26. Circuit 26 is similar to that of FIGS. 5 and 6. It is formed of two branches, one including a resistor R0 and an inductive resistor L0 in series and the other including a resistor R'0 and a capacitor C0 in series. Branch R0, L0 couples the collector of transistor T2 to a supply pad VDD1 having a bonding inductance Lb. Branch R'0, C0 couples the collector of transistor T2 to node X2 of the second circuit stage. Supply pad VDD1 is connected to node X1 of the second stage.

Second stage 50 is similar to the second stage of FIGS. 5 and 6, and it includes the same elements.

Circuit 26 is tuned on the frequency to be amplified. This frequency is that of the carrier originating from the mixer. Circuit 26 can, in this case and to a certain extent, be used as a filter for the signals present on the collector of transistor T2 and a filter is spared. At X2, only the signals to be amplified are present and the fact that circuit 26 is a tuned circuit enables a sufficient current drive of the second stage.

In this embodiment, the first amplifier stage is thus replaced by the last stage of a mixer, impedance matching circuit 26 being used as a filter for the mixer. The assembly, formed on a same integrated circuit, enables substantial silicon surface saving.

Accordingly, the circuit of the present invention is adaptable to many environments. Further, it has higher performance than the circuit of prior art.

As an example, the following table illustrates values obtained by testing amplifier 20 of FIG. 5 and the conventional circuit of FIG. 4.

| Frequencies | State of the art (FIG. 4) | Present invention (FIG. 5) |
| --- | --- | --- |
| 900 MHz | Gp = 14 dB<br>ACPR = −58 dBc<br>NFmax = 8 dB<br>Icc = 45 mA | Gp = 14.5 dB<br>ACPR = −60 dBc<br>NFmax = 4.5 dB<br>Icc = 30 mA |
| 1900 MHz | Gp = 14 dB<br>ACPR = −56 dBc<br>NFmax = 8 dB<br>Icc = 55 mA | Gp = 14.5 dB<br>ACPR = −56 dBc<br>NFmax = 7.5 dB<br>Icc = 38 mA |

The comparative tests have been carried out for two frequencies, 900 MHz and 1900 MHz.

Four parameters have been compared:

Gp, the power gain, expressed in decibels (dB);

ACPR (initials of "Adjacent Channel Power Ratio"), which designates the ratio in decibels (noted dBc, "c" standing for "carrier") between a residual signal found on an adjacent channel and the useful signal; ACPR is all the smaller as the linearity is great;

NFmax, the signal-to-noise ratio, in decibels; and

Icc, the direct current consumed by the circuit, in milliamperes.

At 900 MHz, the measurements have been performed with an output power equal to 8 dBm (the power in dBm is equal to $10.\log[P/P_0]$, P being the power in Watts and $P_0$ equal to 1 milliwatt). At 1900 MHz, the measurements have been performed with an output power equal to 10 dBm.

Analysis of table 1 indicates the following advantages.

At 900 MHz, for a power gain of the same order, the amplifier of the present invention has a much improved linearity (2 addition dB for ACPR). The signal-to-noise ratio is better and the current consumption is lower.

At 1900 MHz, for a power gain of the same order, the current consumption is lower with the circuit of the present invention, the linearity and the signal-to-noise ratio being similar to those of prior art.

Other advantages of the amplifier according to the present invention are listed hereafter.

First, the input, the output, and more generally the structure of the amplifier of the present invention are single-ended. There are many amplifiers with a differential structure in the prior art, since they have a low sensitivity to noise due to the access impedances (mainly bonding inductances) of the various pads, in particular the supply pads.

An advantage of a single-ended structure is that the amplifier consumes less power. Further, in amplifiers with a differential structure, an external transformer ("balun") is connected at the output to obtain a single output referenced to the ground. This transformer, which is bulky, expensive and further has problems of phase shift and losses, is not needed in the present invention.

Thus, as compared to an amplifier with a differential structure, the amplifier of the present invention is particularly advantageous, since it consumes less power and avoids use of an output transformer, while having a low sensitivity to noise.

Also, since its structure is two-staged, the amplifier according to the present invention has a high inverse isolation. Thus, if a signal is injected on the output, for example due to an imperfect output matching, a very small fraction of the injected signal is transmitted to the input. This improves the general performance of the amplifier and increases its stability.

Of course, the present invention is likely to have various alterations, modifications, and improvements which will readily occur to those skilled in the art. Thus, amplifier 20 of FIG. 6B has been described with a second stage replicated once. Of course, the second stage may be replicated more than once, and the signals provided by these second stages may be of different frequencies.

Further, the first stage has been described either as the first stage of an amplifier, or as the last stage of a mixer. The first stage may however be formed by any circuit including a circuit tuned to the frequency to be amplified to ensure the connection with the second stage. Also, the amplifier of the present invention has been described with NPN transistors. Those skilled in the art will easily adapt the amplifier to the case where PNP transistors are used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An amplifier including:
an input circuit tuned to a frequency to be amplified and receiving, as an input, a signal to be amplified,
a first transistor connected in common base, an emitter of which is coupled to the input circuit and a collector of which provides an output signal of the amplifier, and
a feedback circuit feeding back to the base of said transistor a fraction of the output voltage, wherein the feedback circuit is formed by a capacitive bridge formed of a first capacitor coupled between an amplifier output and the base of the first transistor, and of a second capacitor connected in series with the first capacitor and coupled between the base of the first transistor and a virtual ground node.

2. The amplifier of claim 1, wherein said virtual ground node is connected to a first supply pad.

3. The amplifier of claim 2, wherein the virtual ground node is coupled to ground via a third capacitor.

4. The amplifier of claim 1, wherein the feedback circuit includes a second transistor connected as a follower transistor, a base of which is connected to the feedback circuit, an emitter of which is connected to the base of the first transistor and coupled to ground via a first resistor, and a collector of which is connected to a supply voltage.

5. The amplifier of claim 1, wherein the input circuit is formed of two branches, a first branch of the input circuit including a second resistor in series with a first inductive resistor and coupling an input of said circuit to the first supply pad, and a second branch of said circuit including a third resistor in series with a fourth capacitor and coupling the input of the input circuit to the emitter of the first transistor.

6. The amplifier of claim 5, wherein the second branch of the input circuit is duplicated to form several sets, each of said sets being connected to one of the duplicated second branches of the input circuit, and the capacitors of each of said duplicated second branches having different capacitance values, so that the tuning of the input circuit is performed on different frequencies according to the considered second branch.

7. The amplifier of claim 1, including a network formed of a second inductive resistor and of a fifth capacitor connected in parallel, to couple the collector of the first transistor to a second supply pad, and wherein the emitter of the first transistor is coupled to ground by a fourth resistor or a third inductive resistor.

8. The amplifier of claim 1, wherein the first transistor, its connections, and the feedback circuit are duplicated to form several sets, each set being connected to the input circuit and selectively powered so that the amplifier can provide an output signal on one of several outputs.

9. The amplifier of claim 1, wherein the input circuit forms part of an input stage including a third transistor connected in common emitter, receiving on its base the input signal, the emitter of which is coupled to ground by a fourth inductive resistor, and a collector of which is coupled to the input of the input circuit.

10. The amplifier of claim 9, wherein the input circuit and the third transistor are duplicated a predetermined number n of times, the n input circuits being capable of being tuned on close frequencies to slightly increase an amplifier passband and decrease a sensitivity of the amplifier to dispersions due to the technological manufacturing processes.

11. The amplifier of claim 1, wherein the input circuit forms part of a mixer.

12. An amplifier comprising:
a first transistor connected in a common base configuration, an emitter of which receives an input signal and a collector of which provides an output signal of the amplifier; and a feedback circuit for coupling to a base of the first transistor a fraction of the output signal, wherein the feedback circuit comprises a first capacitor and a second capacitor coupled in series between the collector of the first transistor and a virtual around node, wherein the fraction of the output signal is coupled from a connection node of the first and second capacitors to the base of the first transistor.

13. An amplifier as defined in claim 12, wherein said virtual ground node is connected to a supply pad.

14. An amplifier as defined in claim 12, wherein the feedback circuit further comprises a second transistor connected as a follower transistor between the connection node and the base of the first transistor.

15. An amplifier as defined in claim 12, wherein said virtual ground node is coupled to ground through a third capacitor.

16. An amplifier as defined in claim 12, further comprising an impedance matching circuit tuned to a frequency to be amplified and having an input and an output, wherein the output of the matching circuit provides the input signal to the emitter of the first transistor.

17. An amplifier as defined in claim 12, further comprising an inductive resistor and a capacitor connected in parallel between the collector of the first transistor and a supply pad.

18. An amplifier comprising:
an impedance matching circuit tuned to a frequency to be amplified and having an input and an output;
a first transistor connected in a common base configuration, an emitter of which is coupled to an output of said matching circuit and a collector of which provides an output signal of the amplifier;
an input stage including an input receiving an input signal and an output coupled to the input of the matching circuit; and
a feedback circuit for coupling to the base of said first transistor a fraction of the output signal, wherein the feedback circuit comprises a first capacitor and a second capacitor coupled in series between the collector of the first transistor and a virtual ground node, wherein the fraction of the output signal is coupled from a connection node of the first and second capacitors to the base of the first transistor.

19. An amplifier as defined in claim 18, wherein the virtual ground node is connected to a supply pad.

20. An amplifier as defined in claim 19, wherein the virtual ground node is coupled to ground through a third capacitor.

21. An amplifier as defined in claim 18, wherein the feedback circuit further comprises a second transistor coupled as a follower transistor between the connection node and the base of the first transistor.

22. An amplifier as defined in claim 18, wherein the matching circuit comprises a first branch coupling an input of the matching circuit to a first supply pad, and a second branch coupling the input of the matching circuit to the emitter of the first transistor.

23. An amplifier as defined in claim 18, further including an inductive resistor and a capacitor connected in parallel between the collector of the first transistor and a supply pad.

24. An amplifier as defined in claim 18, wherein the input stage includes an input transistor connected in a common emitter configuration, receiving on a base thereof the input signal and having a collector coupled to the input of the matching circuit.

25. An amplifier as defined in claim 18, including two or more input stages and two or more impedance matching circuits, each tuned to a slightly different frequency, wherein the two or more matching circuits have outputs coupled to the emitter of the first transistor and wherein the two or more input stages have common inputs for receiving the input signal.

26. An amplifier as defined in claim 25, wherein each of the two or more input stages comprises an input transistor connected in a common emitter configuration, receiving on a base thereof the input signal and having a collector coupled to an input of one of the impedance matching circuits.

27. An amplifier as defined in claim 18, wherein the input stage comprises a mixer.

28. An amplifier as defined in claim 18, including two or more first transistors each connected in a common base configuration, each having an emitter coupled to an output of said matching circuit and each having a collector which provides an output signal, wherein the amplifier has two or more outputs.

29. An amplifier as defined in claim 28, further including means for selectively enabling the two or more first transistors.

30. An amplifier as defined in claim 18, wherein the first transistor comprises a silicon bipolar transistor.

* * * * *

UNITED STATES PATENT AND TRADEMARK OFFICE
CERTIFICATE OF CORRECTION

| | |
|---|---|
| PATENT NO. | : 7,023,279 B2 |
| APPLICATION NO. | : 10/111122 |
| DATED | : April 4, 2006 |
| INVENTOR(S) | : Jean-Charles Grasset and Christophe Pinatel |

It is certified that error appears in the above-identified patent and that said Letters Patent is hereby corrected as shown below:

<u>Column 11,</u>
Line 5, should read -- the first transistor and a virtual ground node, wherein --.

Signed and Sealed this

Fourth Day of July, 2006

JON W. DUDAS
*Director of the United States Patent and Trademark Office*